United States Patent [19]

Chen et al.

[11] Patent Number: 6,139,992
[45] Date of Patent: Oct. 31, 2000

[54] PHOTOMASK USED IN FABRICATION OF MASK READ ONLY MEMORY

[75] Inventors: G. L. Chen, Hsinchu Hsien; Jack Tseng, Hsinchu, both of Taiwan

[73] Assignee: United Microelectronics Corp, Hsinchu, Taiwan

[21] Appl. No.: 09/227,960

[22] Filed: Jan. 11, 1999

[51] Int. Cl.[7] ....................................................... G03F 9/00
[52] U.S. Cl. .................................................................. 430/5
[58] Field of Search ............................... 430/5, 311, 312, 430/314, 322; 438/308

[56] References Cited

U.S. PATENT DOCUMENTS 5,989,783   11/1999   Huggins et al. ........................ 430/316

*Primary Examiner*—S. Rosasco
*Attorney, Agent, or Firm*—J. C. Patents; Jiawei Huang

[57] ABSTRACT

A photomask used in a formation of a mask read only memory (mask ROM) device is provided. The photomask contains a bonding pad opening pattern and a code area opening pattern so that bonding pads and code areas are simultaneously formed in a more economical operation.

17 Claims, 5 Drawing Sheets

PHOTOMASK USED IN FABRICATION OF MASK READ ONLY MEMORY

BACKGROUND OF THE INVENTION

1. Field of the Invention

This invention relates to semiconductor fabrication, and more particularly to a photomask used in fabrication of a mask read only memory (ROM) device.

2. Description of Related Art

A memory device is widely used in the information industry, and is particularly used in microprocessors and computers. In order to achieve a faster speed of information exchange with more tremendous quantity in a more convenient way, the information products need the properties of small dimensions and reduced weight. The properties are necessarily met by a memory with higher memory capacity and faster access speed. Currently, a mask ROM with embedded bit lines is a common memory structure because it can be fabricated with very high integration.

The fabrication of a memory device includes not only forming a memory cell and encoding but also forming bonding pads. The fabrication processes for encoding and forming bonding pads also include photomasks with proper patterns.

A phototmask typically includes a transparent substrate, such as glass or quartz, a chromium shielding layer to form a desired pattern and an anti-reflection layer, such as a titanium nitride layer. The desired pattern of the photomask is transferred onto a semiconductor substrate through a light source so that it has an intrinsic issue of a pattern resolution. Particularly, when device dimension goes down to 0.25 microns or smaller, the light interference effect is stronger, and the pattern resolution cannot be further enhanced. Another typical design of a photomask, called a phase shift mask, is therefore proposed to improve the pattern resolution. The phase shift mask still uses light to transfer the pattern but includes one phase shift layer which can shift the light wave phase by 180 degrees to cause a light amplitude subtraction at the interface. Thus, the pattern resolution is improved.

FIGS. 1A–1D are cross-sectional views schematically illustrating a conventional fabrication process to form a mask ROM with a conventional photomask. In FIG. 1A, a silicon substrate 101 includes a memory region 105 and a bonding pad region 103. At the memory region 105, several bit lines 107 and word lines 111 are formed. At the bonding pad region 103, a field oxide layer 109 is formed. At this stage, the word lines 111 and the field oxide layer 109 remain exposed. A silicon oxide layer 113 is formed over the substrate 101 to cover the word lines 111 and the field oxide layer 109. A barrier layer 115 is formed on the silicon oxide layer 113. Then, processes for encoding the ROM device with a desired code, such as an execution program code, are performed at the memory region 105. Bonding pads are formed at the bonding pad region 103. The program code usually is determined by users, who order the ROM device, so the program code may be different in each order. In order to reduce fabrication time, a pad pattern is formed beforehand at the bonding pad region, since it has more common property. The formation of the program code at the memory region can wait until an order from the user.

Continuing to FIG. 1A, a photoresist layer 117 is formed on the barrier layer 115. A photomask 102 with an opening pattern is used to pattern the photoresist layer 117 to form a pad opening pattern, which is used for a formation of bonding pads later. Using the photoresist layer 117 with the pad opening pattern, the barrier layer 115 including titanium nitride is patterned to form an opening 119, which exposes the silicon oxide layer 113. A top view of the photomask 102 is shown in FIG. 2A. The opening pattern of the photomask 102 includes openings 207. The photomask 102 shown in FIG. 1A is one of the openings 207 at one side. The purpose of the opening 119 is to allow a bonding pad to be firmly formed later at the opening 119. This is because the bonding pad usually is made of aluminum, which has poor adhesion capability with the titanium nitride of the barrier layer 115. If the bonding pad is directly formed on the barrier layer 115, it may be easily pulled apart, and lose its contact with the ROM device.

In FIG. 1B, the photoresist layer 117 is removed. An encoding process is performed. The encoding process includes depositing a photoresist layer 121 over the substrate 101 to cover the barrier layer 115 and the silicon oxide layer 113 at a portion within the opening 119. A photomask 104 with a desired pattern required by users is used to pattern the photoresist layer 121, and then code areas 123, 125 are formed by further patterning the barrier layer 115, using the photoresist layer 121. The code areas 123 and 125 expose a portion of the silicon oxide layer 113. A top view of the photomask 104 is schematically illustrated in FIG. 2B. In FIG. 2B, the photomask 104 includes an opening pattern, which further includes several openings 203. Each of the openings 203 forms a code area. In FIG. 1B, the two code areas 123 and 125 are shown.

In FIG. 1C, using the photoresist layer 121 as a mask, an ion implantation process 122 is performed to implant phosphorus ions into the substrate 101 to form channel regions 127 and 129, corresponding to the code areas 123 and 125. A desired code is formed.

In FIG. 1D, the photoresist layer 121 is removed, and a metal layer is deposited over the substrate 101. After photolithography and etching, the metal layer and the barrier layer 115 of FIG. 1B are patterned to form a metal line pattern 133 and a bonding pad pattern 131. A passivation layer 135 is formed over the substrate 101 to protect the ROM device from damage. The passivation layer 135 is patterned to form an opening 137 that exposes the bonding pad pattern 131 so as to allow the device to be coupled to a lead frame through a bonding wire during packaging the ROM device.

In the conventional fabrication process described above, after the opening 119 is formed, it usually waits for a certain time until the order is placed. During this period, the barrier layer 115 may be easily eroded by the residual etchant from the previous etching process. Moreover, the formation of the opening 119 and the code areas 123 and 125 is performed by two individual steps of photolithography and etching. The fabrication cost and the fabrication efficiency are still not the most economical.

SUMMARY OF THE INVENTION

It is therefore an objective of the present invention to provide a photomask used for a formation of a mask ROM device so as to simultaneously form a code area pattern and a bonding pattern. As a result, erosion of a barrier layer included in the mask ROM device is effectively avoided. In addition, fabrication cost and fabrication time is reduced.

In accordance with the foregoing and other objectives of the present invention, an improved photomask, suitable for a formation of a mask ROM device, is provided. The improved photomask includes a code area opening pattern at a memory region and a bonding pad opening pattern at a bonding pad region, in which each of the code area opening patterns and the bonding pad opening patterns includes several desired openings.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention introduces a photomask that includes a code area opening pattern and a bonding pad opening pattern combined together so that the bonding pads and code areas are simultaneously formed. Moreover, since the bonding pads and code areas can be simultaneously formed, there is no transition time between the bonding pad being formed beforehand and the code areas being actually formed later.

Figure 3A:
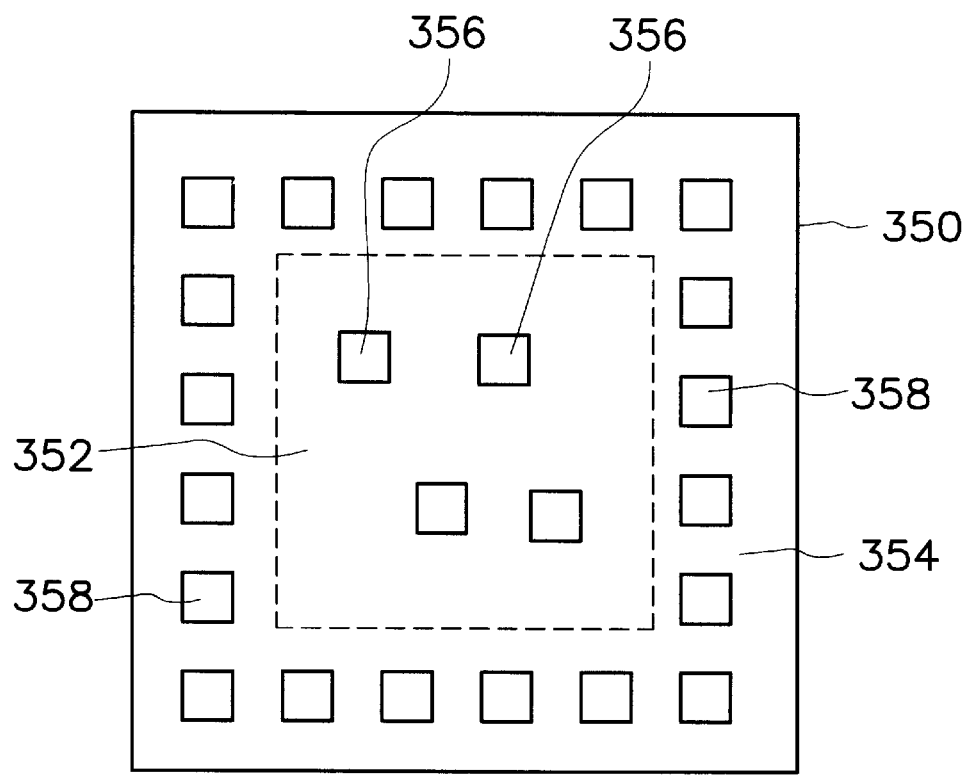
FIG. 3A is a top view of a photomask, schematically illustrating an opening pattern layout, according to a preferred embodiment of the invention.
Figure 3B:
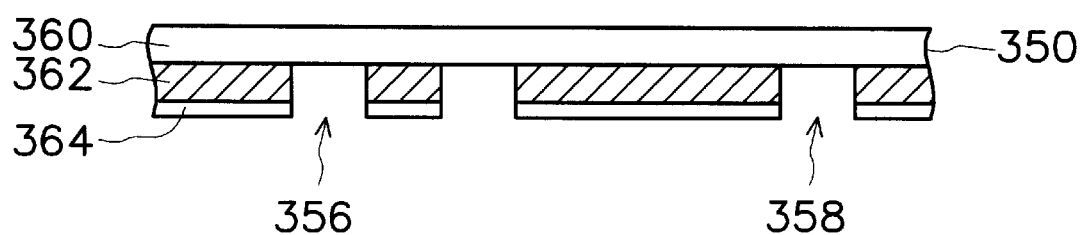
FIG. 3B is a cross-sectional view of a portion of a photomask, schematically illustrating a pattern layout of the photomask, according to a preferred embodiment of the invention.

FIG. 3A is a top view of a photomask, schematically illustrating an opening pattern layout, according to a preferred embodiment of the invention. FIG. 3B is a cross-sectional view of a portion of a photomask, schematically illustrating a pattern layout of the photomask, according to a preferred embodiment of the invention.

In FIG. 3A, a photomask 350 includes a code area pattern region 352, which usually is at the central part of the photomask 350 and includes several code area openings 356. A bonding pad pattern region 354 including several bonding pad pattern openings 358 usually surrounding the code area pattern region 352. A layout of the code area pattern region 352 and the bonding pad pattern region 354 shown in FIG. 3A is just an example. The actual layout should depend on the user's requirements. The code area pattern region 352 particularly may have various different layouts.

FIG. 3B is a cross-sectional view of a portion of a photomask, schematically illustrating a pattern layout of the photomask, according to a preferred embodiment of the invention. In FIG. 3B, the photomask 350, which can be a normal photomask or a phase shift photomask, usually includes a transparent substrate 360, a shielding pattern layer 362 on the transparent substrate 360, and an antireflection layer 364 on the shielding pattern layer 362. The transparent substrate 360 includes, for example, glass or quartz. The shielding pattern later 362 includes, for example, chromium, and is formed with a desired pattern layout. As shown in FIG. 3A, the pattern layout includes a code area opening 356 belonging to a code area pattern region 352 and a bonding pad pattern opening 358 belonging to a bonding pad pattern region 354. The antireflection layer 364 including, for example, chromium oxide or titanium nitride is used to prevent a light reflection during photolithography to transfer the pattern layout onto a fabricating semiconductor substrate. If a phase shift photomask layer is desired, a phase shift layer (not shown) should also be included in the transparent substrate 360 to produce a shift angle of 180 degrees of light wave phase at desired locations. The phase shifter layer includes, for example, $MoSi_ZO_XN_Y$.

Figure 3C:
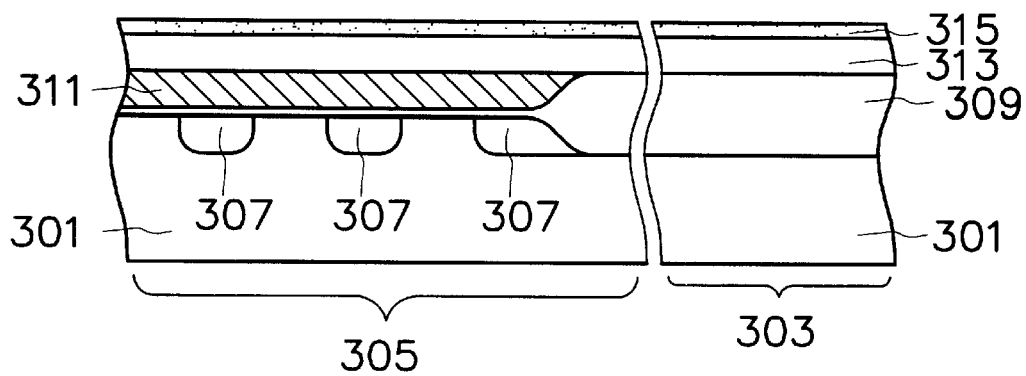
FIGS. 3C–3E are cross-sectional views of a portion of a substrate, schematically illustrating a fabrication process to form a mask ROM with a photomask of FIG. 3A, according to a preferred embodiment of the invention.
Figure 3D:
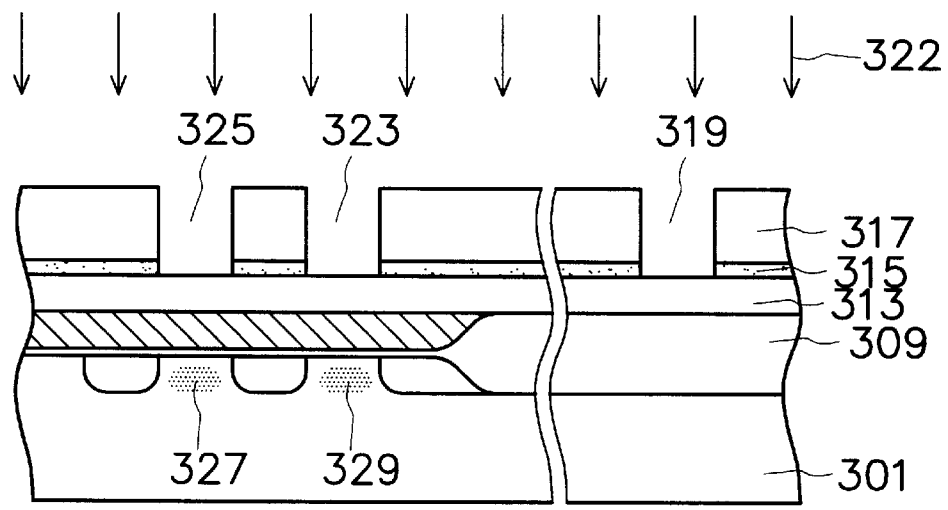
Figure 3E:
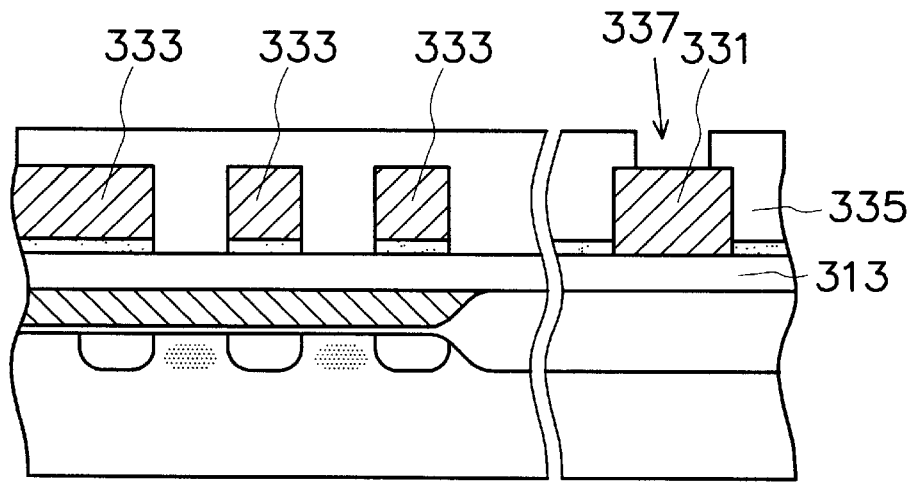

FIGS. 3C–3E are cross-sectional views of a portion of a substrate, schematically illustrating a fabrication process to form a mask ROM with a photomask of FIG. 3A, according to a preferred embodiment of the invention. In FIG. 3C, a semi-manufactured mask ROM is formed by the following steps. A semiconductor substrate 301 includes a memory region 305 and a bonding pad region 303. At the memory region 305, several bit lines 307 and word lines 311 are formed. At the bonding pad region 303, a field oxide layer 309 is formed. At this stage, the word lines 311 and the field oxide layer 309 both remain exposed. A dielectric layer 313 including, for example, silicon oxide is formed over the substrate 301 to cover the word lines 311 and the field oxide layer 309. A barrier layer 315 including, for example, titanium nitride is formed on dielectric layer 313. The formation of the dielectric layer 313 includes, for example, chemical vapor deposition (CVD). The formation of the barrier layer 315 includes, for example, forming a titanium layer by sputtering deposition, and nitriding the titanium layer at a high temperature environment with, for example, nitrogen gas or ammonium gas.

Figure 1A:
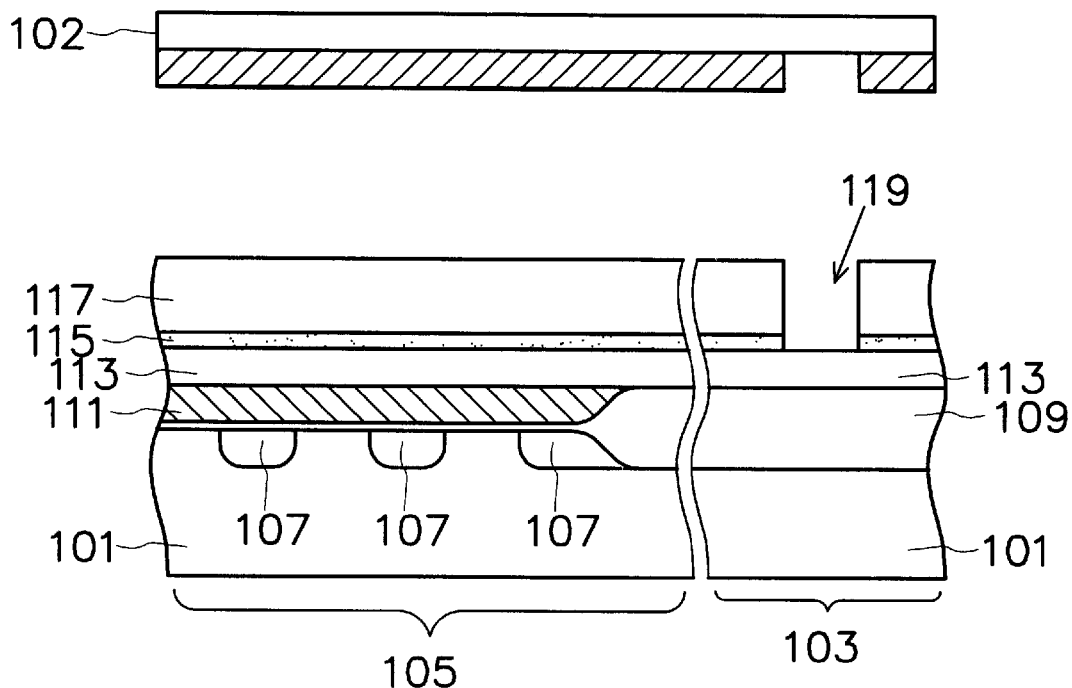
FIGS. 1A–1D are cross-sectional views, schematically illustrating a conventional fabrication process to form a mask ROM with a conventional photomask.
Figure 1B:
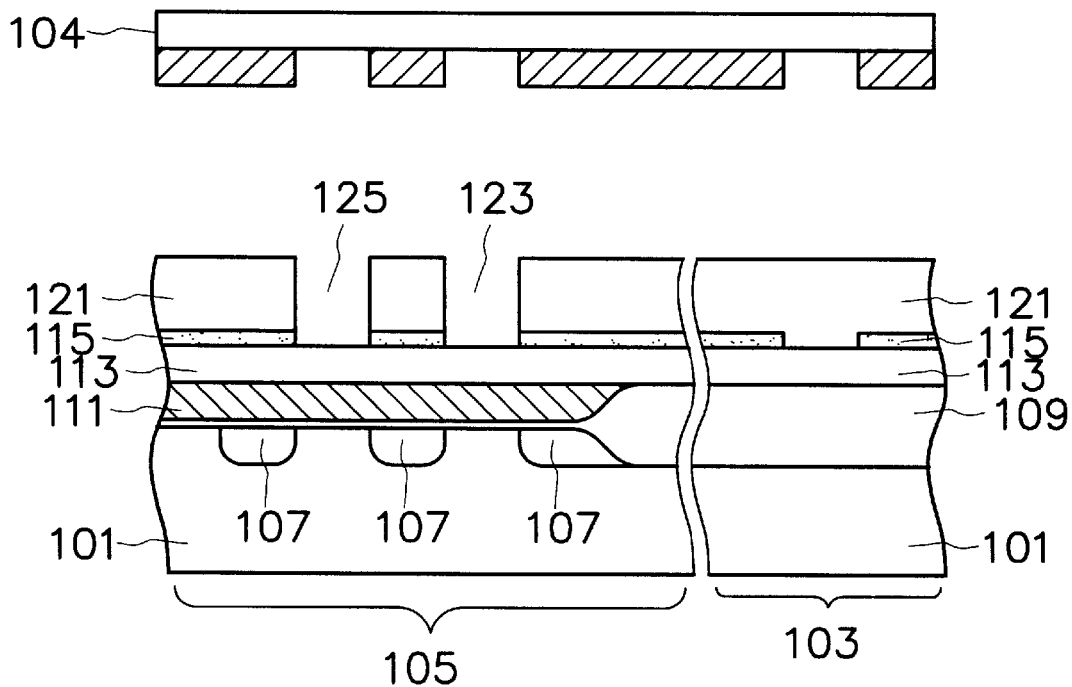
Figure 1C:
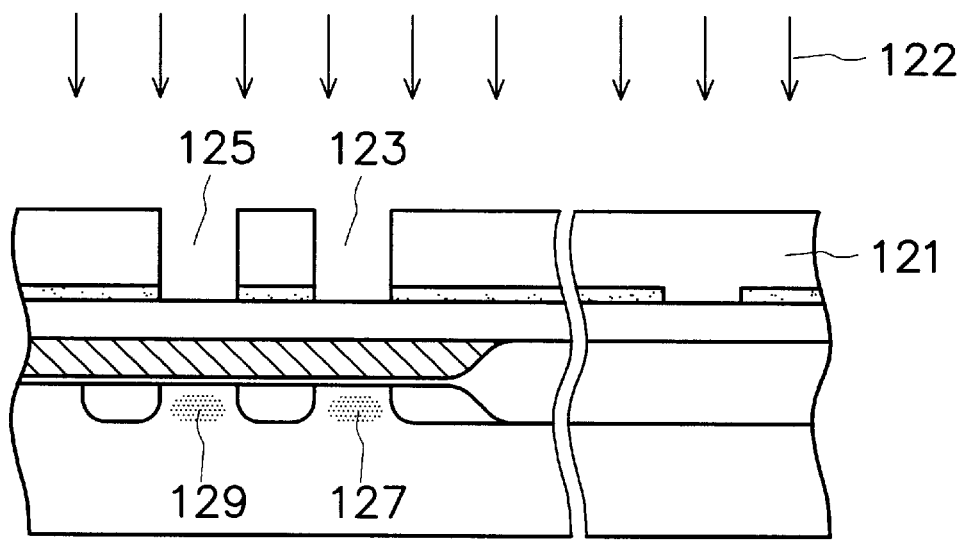
Figure 1D:
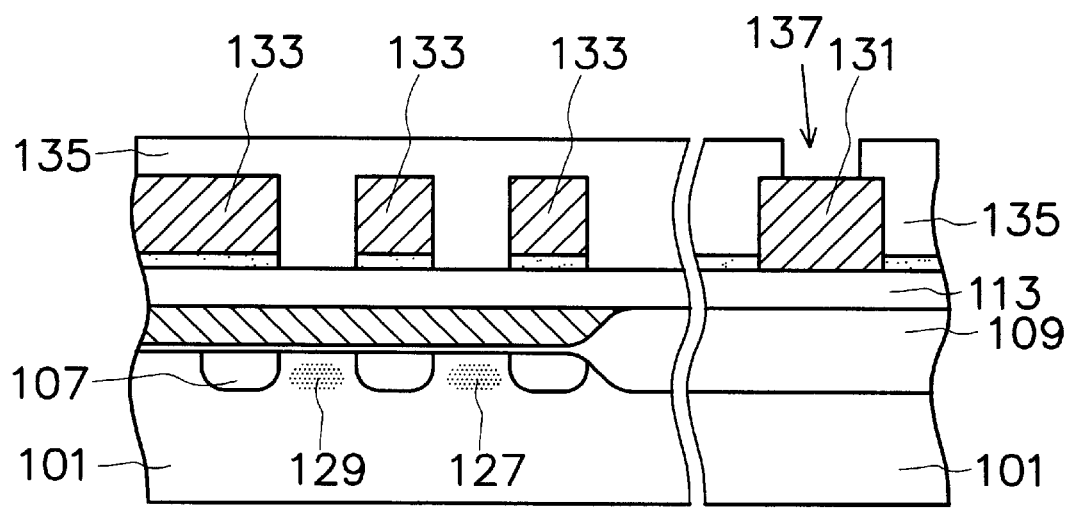
Figure 2A:
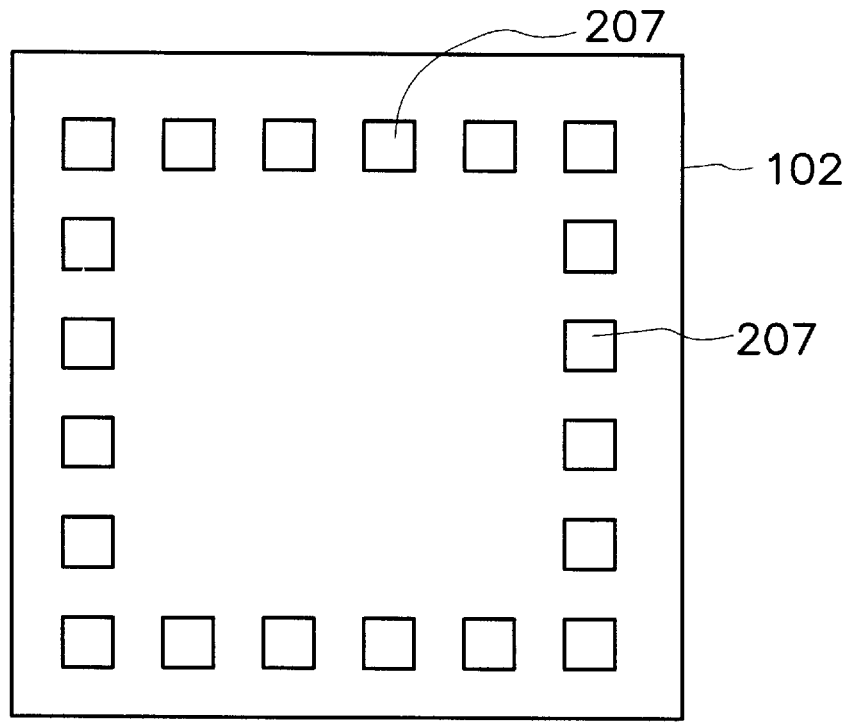
FIG. 2A and FIG. 2B are top views of two conventional photomasks, schematically illustrating opening patterns.
Figure 2B:
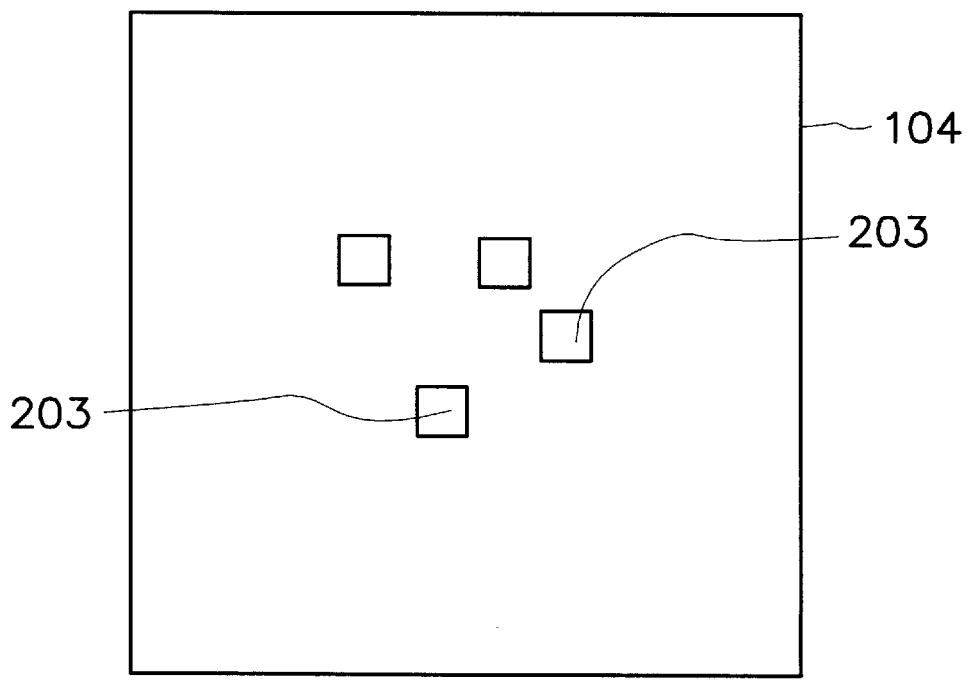

In FIG. 3D, a photoresist layer 317 is formed on the barrier layer 315. Using the photomask shown in FIG. 3B for a photolithography process, the photoresist layer 317 is patterned to form, for example, a code area 323, a code area 325, and a bonding pad opening 319, all of which expose a portion of the barrier layer 315. The barrier layer 315 is further etched to remove its exposed portion so as to expose a portion of the dielectric layer 313. Using the photoresist layer 317 and the barrier layer 315 as a implanting mask, an ion implantation process 322 is performed to implant, for example, phosphorus ions into the substrate 301 to form several code areas 327 and 329 below the word lines 311. The barrier layer 315 also serves a mask function to the ion implantation process 322 due to its high material density. At this stage, the memory region 305 is coded and the bonding pad opening 319 is simultaneously formed because the photomask includes the code area opening 356 and the bonding pad pattern opening 358, as shown in FIG. 3B. This is one characteristic of the invention. In the conventional method, the bonding pad opening 119 of FIG. 1A is formed beforehand by performing once of photolithography and etching. The semi-manufactured device waits for a certain period of time until an order is placed. During this waiting period, the barrier layer 115 may be eroded by residual etchant, and can result in poor device performance.

In FIG. 3E, the photoresist layer 317 is removed, and a metal layer 333 including, for example, aluminum is deposited over the substrate 301 by, for example, sputtering deposition. After photolithography and etching, the metal layer 333 and the barrier layer 315 of FIG. 3D are patterned to form a metal line pattern 333 and a bonding pad pattern 331. A passivation layer 335 is formed over the substrate 301 to protect the ROM device from damage. The passivation layer 335 including, for example, silicon oxide is formed by atmospheric CVD (APCVD) and is patterned to form an opening 337 at the bonding pad region 303 of FIG. 3C. The opening 337 exposes the bonding pad pattern 331 so as to allow the device to be coupled to a lead frame through a bonding wire when packaging the ROM device.

In conclusion, the invention includes the following characteristics:

1. Since the code areas 323 and 325 and the bonding pad opening 319 are simultaneously formed, a photolithography and etching step is eliminated. This reduces fabrication cost and fabrication time.
2. Since there in no waiting time between the formation of the bonding pad opening 319 and the formation of the code areas 323 and 325, the barrier layer 315 is not eroded by residual etchant. The device performance is maintained.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A photomask, suitable for fabricating a mask-type read only memory (ROM) device, the photomask comprising:

a transparent substrate; and a shielding layer on the transparent substrate, wherein the shielding layer has a pattern layout comprising a code area pattern region and a bonding pad pattern region surrounding the code area region.

2. The photomask of claim 1, wherein the code area pattern comprises a code area opening.

3. The photomask of claim 1, wherein the bonding pad pattern comprises a bonding pad pattern opening.

4. The photomask of claim 1, wherein the photomask is suitable for a fabrication process, which comprises:

providing a semi-manufactured memory device, which comprises a memory region, a bonding pad region, wherein the memory region comprises a plurality of bit lines and a plurality of word lines;

forming a dielectric layer and a barrier layer in sequence on the semi-manufactured memory device;

forming a photoresist layer on the barrier layer;

patterning the photoresist layer with the photomask serving as an etching mask so as to expose a first portion of the barrier layer at the memory region through the code area pattern region and a second portion of the barrier layer at the bonding pad region through the bonding pad region;

etching and removing the exposed first and second portions of the barrier layer simultaneously so that portions of the dielectric layer are exposed by a code area opening and a bonding pad opening; and performing an ion implantation process to code the memory region.

5. The photomask of claim 4, wherein after the step of performing an ion implantation process to code the memory region, further comprises:

forming a metal line layer on the barrier layer at the memory region, and a bonding pad at the bonding pad region, and forming a passivation layer over the semi-manufactured memory device;

forming an opening in the passivation layer to expose the bonding pad.

6. The photomask of claim 4, wherein the metal line layer comprises aluminum.

7. The photomask of claim 4, wherein the barrier layer comprises titanium nitride.

8. The photomask of claim 4, wherein the step of performing the ion implantation process comprises implanting ions onto the substrate within the code area below the word lines.

9. The photomask of claim 8, wherein the ions comprises phosphorus ions.

10. The photomask of claim 4, wherein the barrier layer comprises titanium nitride.

11. The photomask of claim 1, wherein the photomask comprises a normal photomask without a phase shift layer.

12. The photomask of claim 1, wherein the photomask comprises a phase shift photomask.

13. A photomask, suitable for fabricating a mask-type ROM device, the photomask comprising:

a transparent substrate; and a patterned shielding layer on the transparent substrate, wherein the shielding layer has a pattern layout comprising a code area pattern region and a bonding pad pattern region surrounding the code area region.

14. The photomask of claim 13, wherein the photomask further comprises an anti-reflection layer on the patterned shielding layer.

15. The photomask of claim 14, wherein the anti-reflection layer comprises chromium oxide.

16. The photomask of claim 14, wherein the anti-reflection layer comprises titanium nitride.

17. The photomask of claim 13, wherein the patterned shielding layer comprises chromium.

* * * * *